US005115883A

United States Patent [19]

Morikawa et al.

[11] Patent Number: 5,115,883

[45] Date of Patent: May 26, 1992

[54] LOUDSPEAKER

[75] Inventors: Hideaki Morikawa; Yasuo Gan; Koushiro Kogure; Takashi Ooyaba, all of Tokorozawa, Japan

[73] Assignee: Pioneer Electronic Corporation, Tokyo, Japan

[21] Appl. No.: 578,929

[22] Filed: Sep. 7, 1990

[30] Foreign Application Priority Data

Apr. 27, 1990 [JP] Japan ................................ 2-113811

[51] Int. Cl.[5] ........................ H05K 5/00; G10K 11/00

[52] U.S. Cl. .................................... 181/152; 181/184

[58] Field of Search ........................ 181/152, 184, 151

[56] References Cited

U.S. PATENT DOCUMENTS

| | | | |
|---|---|---|---|
| 1,643,284 | 9/1927 | Blieberger | 181/184 |
| 1,840,992 | 1/1932 | Weitling | 181/184 |
| 4,893,695 | 1/1990 | Tamura et al. | 181/184 X |

*Primary Examiner*—Russell E. Adams
*Assistant Examiner*—Jae Noh
*Attorney, Agent, or Firm*—Nikaido, Marmelstein, Murray & Oram

[57] ABSTRACT

A horn shaped baffle is provided in the front of a loudspeaker. Escape holes are formed in the horn shaped baffle so as to emit sound waves deviated from the axis of the loudspeaker. A sound absorptive panel is provided on the outside of the baffle so as to cover the holes.

3 Claims, 4 Drawing Sheets

LOUDSPEAKER

BACKGROUND OF THE INVENTION

The present invention relates to a loudspeaker having a narrow directivity and more particularly to a horn loudspeaker.

The loudspeaker is roughly divided into an electrodynamic speaker using magnetic flux and electromagnetic force caused by electric current, and an electrostatic speaker using electrostatic force between electrodes in accordance with the operating principle of the speaker.

A directional characteristic of the speaker is usually indicated by a sound pressure frequency characteristic at an angular position of 30° or 60° with respect to the forward axis of the speaker. The characteristic is considered as an important factor in sound reproduction performance of a stereo system. More particularly, since the best listening position for ordinary stereo reproduction is a location where the distances to the right and left speakers are substantially equal, the position is angularly deviated from the forward axis of each speaker by some degrees. Hence, when the speaker has a poor directional frequency characteristic, sound is not sufficiently reproduced in the middle and high frequency ranges and inferior in life-like performance.

On the other hand, a speaker with a narrow directivity is preferable for radiating sound only in a predetermined area.

FIG. 4 shows an example of a conventional horn speaker, which comprises a radiating element 1 and a horn 2. The sound wave from a diaphragm provided inside the radiating element 1 propagates through the horn 2 instead of immediately diffusing. The directivity of the sound depends on the size of the opening of the horn 2. Compared to a direct-radiator speaker, the directivity of the horn speaker can be easily narrowed.

Referring to FIG. 5, a speaker S is provided at a front portion thereof with a cabinet 3 made of a sound insulating material having a cylindrical sound absorptive board 6 at a center therein. A sound absorptive element 5 comprising a sound absorptive material 4 is provided in the cabinet 3. The cylindrical sound absorptive board 6 is so disposed as to be parallel to the axis X of the speaker. The sound waves off the axis X are absorbed by the absorptive material 4 to obtain a narrow directivity.

However, in order to obtain the narrow directivity even in a low-frequency range, the diameter of the opening of the horn 2 must be increased, which causes the enlarging of the speaker.

Moreover, sound waves which are reflected at the opening of the horn affect the sound waves propagating along the axis of the speaker. Hence, as shown in FIGS. 6 and 7, showing frequency responses of the speakers shown in FIGS. 4 and 5 respectively, peak dips of the sound pressure appear in the characteristics.

Furthermore, in the speaker shown in FIG. 5, the sound waves reflected by the cabinet 3 affect the sound waves on-axis, causing lobes in the characteristic lines as shown in FIG. 7. The lobes and peak dips generated in the reproduced sound waves deteriorate the reproduction characteristics of the speaker.

SUMMARY OF THE INVENTION

The object of the present invention is to provide a loudspeaker having a narrow directivity which may improve the reproduction characteristic thereof.

In the speaker of the present invention, some of the sound waves deflected from the axis of the speaker are transmitted, passing through escape openings and a sound absorptive panel provided on a horn baffle, and some of the waves are diffracted at the end opening of the horn baffle, thereby escaping from the speaker. The axial length of the horn baffle and the position of the escape opening are determined such that the phase difference of the transmitted waves and the diffracted waves becomes 180° to cancel the waves with each other. Thus, the sound waves off the axis are prevented from affecting the sound waves propagating along the axis. Since only the sound waves propagating along the axis are emitted from the speaker, the narrow directivity is improved.

According to the present invention, there is provided a loudspeaker having a radiating element, comprising a baffle having a horn shape provided in the front of the radiating element and having escape holes, and a sound absorptive panel provided on the outside panel provided on the outside of the baffle so as to cover the holes. The holes are located to escape sound waves deviated from the axis of the loudspeaker.

In as aspect of the invention, the length of the baffle and the position of the hole are determined such that the phase difference between the waves transmitted from the hole and the waves diffracted from a front end of the baffle is 180°.

The other objects and features of this invention will become understood from the following description with reference to the accompanying drawings.

DETAILED DESCRIPTION OF THE PREFERRED EMBODIMENT

Figure 1:
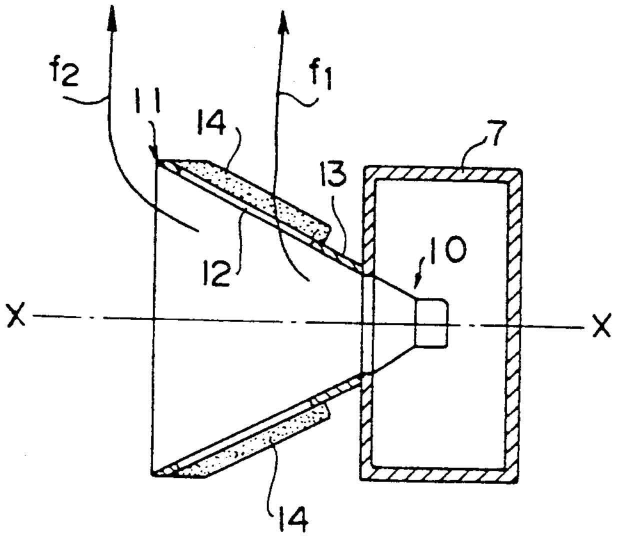
FIG. 1 shows a sectional view of an embodiment of a loudspeaker according to the present invention.

Referring to FIG. 1, a speaker of the present invention is provided with a closed-box baffle 7 in which a speaker 10 is mounted. A baffle 11 is mounted on an outer periphery of an opening of the speaker 10 in the closed-box baffle 7.

The baffle 11 has a horn shaped baffle 13 provided with escape openings 12 and a sound absorptive panel 14 provided on the outside of the baffle so as to cover the escape openings 12. The sound waves deviating from the axis X of the speaker escape from the escape openings 12 and some of the waves are absorbed by the sound absorptive panel 14.

Figure 2:
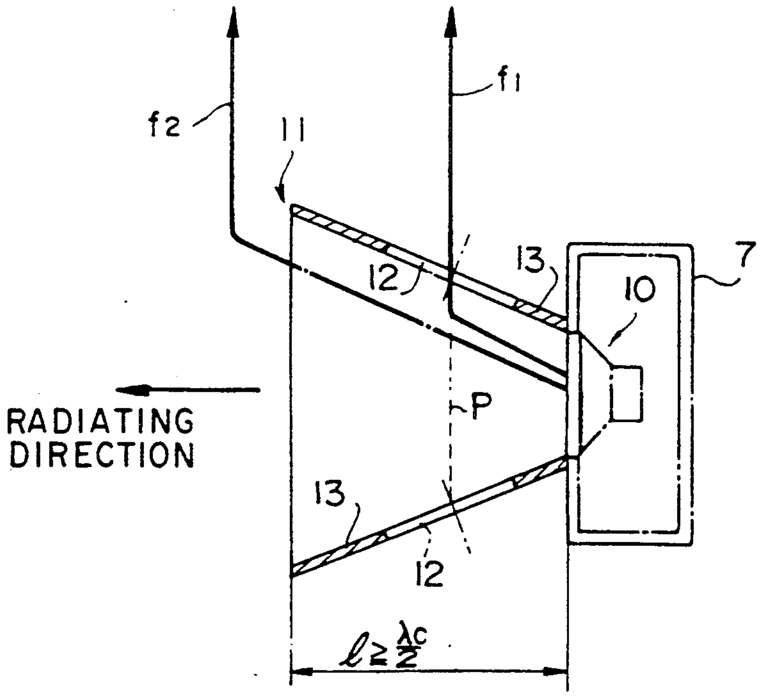
FIG. 2 is a diagram explaining a length of a horn shaped baffle and a size of an escape opening thereof in the speaker shown in FIG. 1.

Preferably, the axial lengths of the horn baffle 13 and the escape opening 12 are determined as shown in FIG. 2. Namely, (1) The axial length l of the horn shaped baffle 13 is at least one-half of the wavelength λ c of the sound waves to be attenuated.

(2) The escape opening 12 is annular and has an area of one-half to 1 times as large as the area of the section of the horn shaped baffle 13 sectioned along a plane P passing the center of the opening.

Moreover, the escape openings 12 are so located that the difference between a path length of a wave f2 diffracted at the end opening of the horn baffle 13 and a path length of the wave passing through the escape openings 12 at the center thereof is λ c/2.

The sound absorptive panel 14 is made of porous sound absorbent such as glass wool and has a thickness of about 8mm. The material and the thickness of the absorbent depend on the frequency band of the waves to be absorbed. For example, a thick absorbent absorbs a low frequency waves.

The operation of the speaker of the present invention is described hereinafter.

The sound waves generated by a diaphragm (not shown) in the speaker 10 are emitted in the baffle 11. The sound waves on the axis emerges from the speaker passing through the horn baffle 13.

Some of the sound waves which propagate off the axis X pass through the escape openings 12 of the horn shaped baffle 13 and escape from the speaker passing through the sound absorptive panel 14 (transmitted waves f1). The reminder of the sound waves deviated from the axis are diffracted at the end opening of the baffle 11 (diffracted wave f2).

Figure 3:
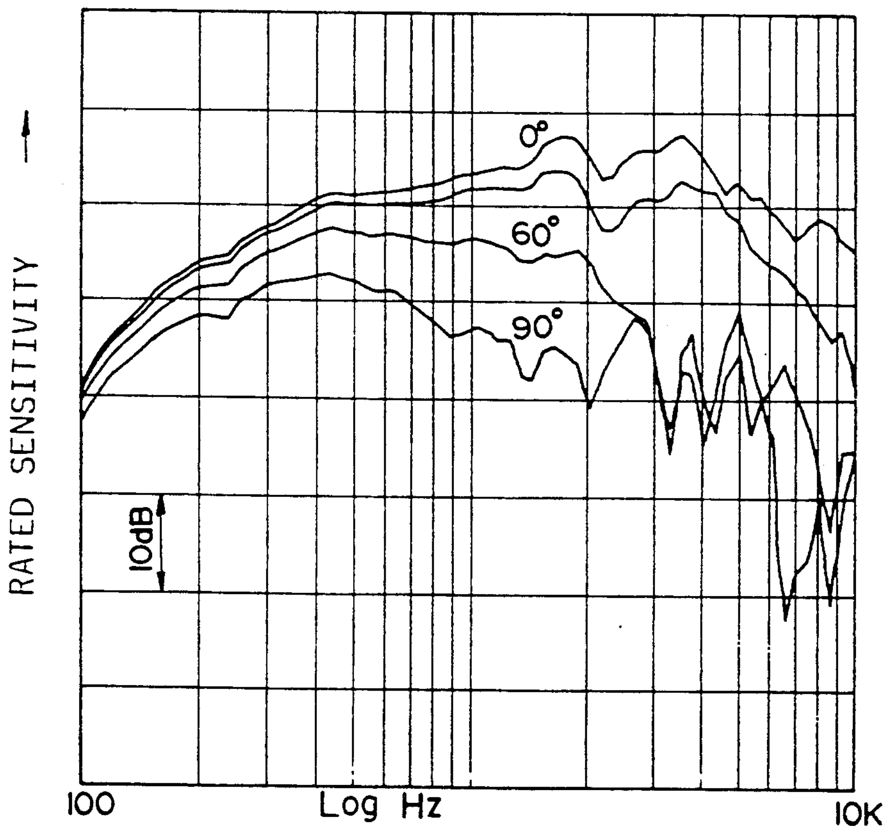
FIG. 3 is a graph showing reproduction characteristic of the speaker of the present invention.
Figure 4:
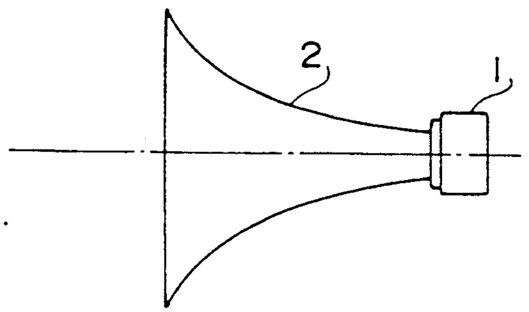
FIG. 4 PRIOR ART
FIG. 4 shows a side elevational view of a conventional horn speaker.
Figure 5:
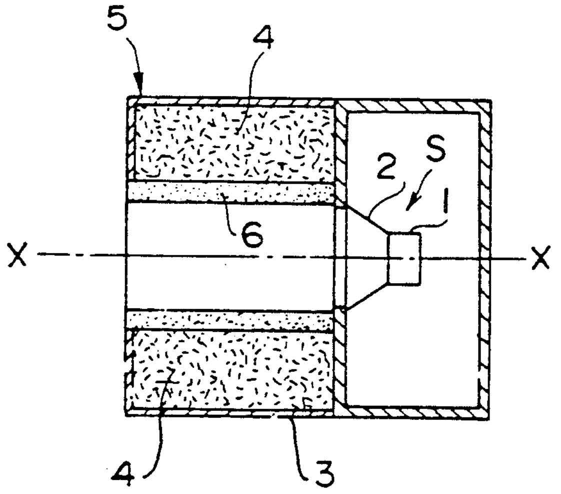
FIG. 5 PRIOR ART
FIG. 5 shows a sectional view of another conventional speaker.
Figure 7:
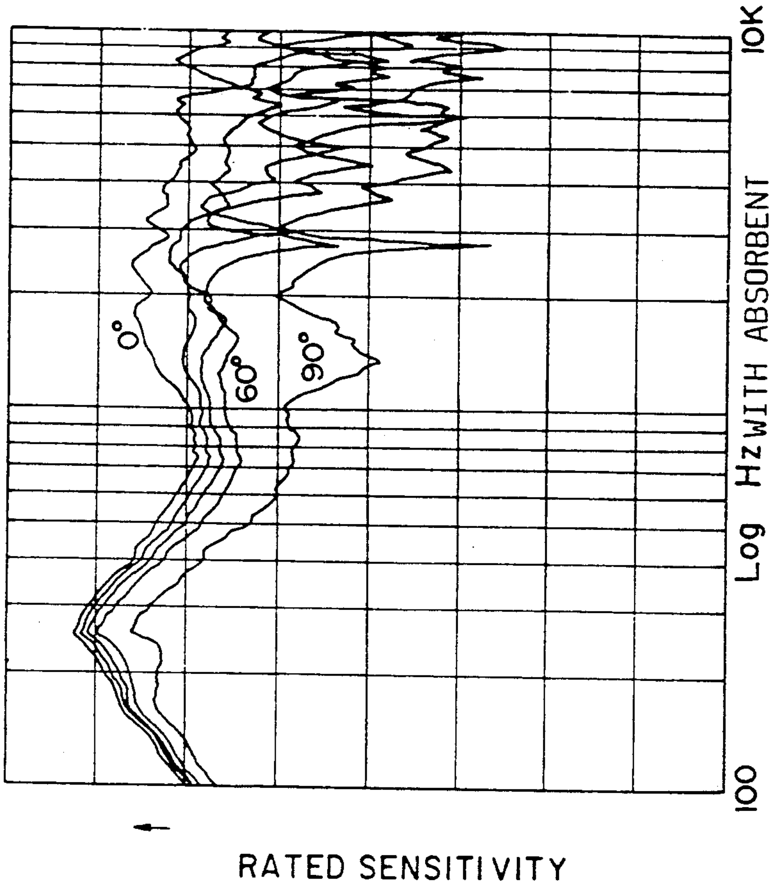
FIG. 7 is a graph showing a reproduction characteristic of the speaker shown in FIG. 5.
Figure 6:
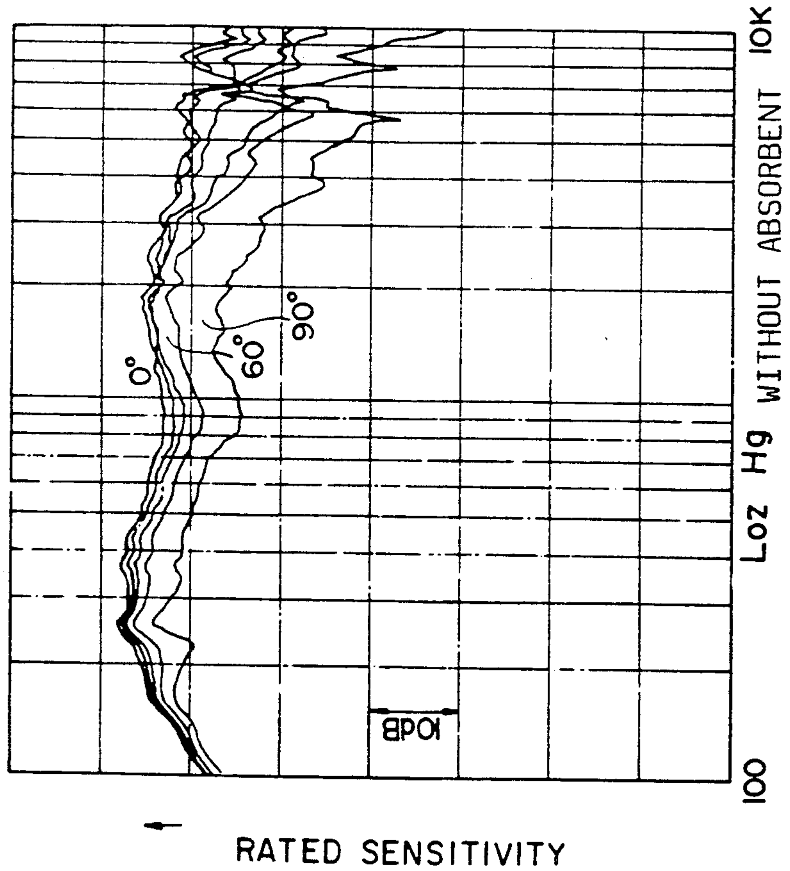
FIG. 6 is a graph showing a reproduction characteristic of the speaker shown in FIG. 4.

The axial length l of the horn shaped baffle 13 and the positions of the escape openings 12 is appropriately determined so that the transmitted waves f1 and the diffracted waves f2 are cancelled with each other around a frequency where the phase difference between the transmitted waves and the diffracted waves is 180°, thereby decreasing sound pressure at the frequency. Hence, transmission sound waves f1 and diffracted sound waves f2 are prevented from reflecting which affects the sound waves on the axis. Consequently, lobes and peak dips are reduced as shown in FIG. 3.

Thus, in the speaker of the present invention, the transmitted waves and diffracted waves, which are deflected from the axis of the speaker are cancelled by each other, thereby decreasing the sound pressure. As a result, the sound waves on the axis X is prevented from being affected by the reflected waves so that lobes and peak dips in the reproduced sound waves are reduced. In addition, only the sound waves which propagate along the axis of the speaker is generated from the speaker so that a narrow directivity of the sound waves is enhanced. Thus, the reproduction characteristics of the speaker is improved.

From the foregoing it will be understood that the present invention provides a speaker where the sound waves propagating along the axis of the speaker are protected from influences caused by waves deflecting from the axis. Only the sound waves travelling along the axis emerge from the speaker so that the directivity is narrowed to improve the reproduction characteristics of the speaker.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A loudspeaker, comprising:

a baffle having a horn shape provided in a front of said loudspeaker and having sound escape holes, an axial length of said baffle being at least one-half wavelength of sound waves emitted by said loud speaker, and each sound escape hole having an area one-half of one times as large as an area of a section of the baffle sectioned along a plane passing through a center of said each sound escape hole; and a sound absorptive panel provided on an outside of said baffle so as to cover said sound escape holes.

2. The loudspeaker according to claim 1 wherein said sound escape holes are located to emit sound waves deviated from an axis of the loudspeaker.

3. The loudspeaker according to claim 1 wherein the length of said baffle and a position of each said sound escape hole are determined such that a phase difference between the waves transmitted from each sound escape hole and the wave diffracted from a front end of said baffle is 180°.

* * * * *